United States Patent
Park et al.

(10) Patent No.: US 8,970,108 B2
(45) Date of Patent: Mar. 3, 2015

(54) ORGANIC LIGHT EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Soon-Ryong Park, Yongin (KR); Woo-Suk Jung, Yongin (KR); Hee-Seong Jeong, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 228 days.

(21) Appl. No.: 13/673,889

(22) Filed: Nov. 9, 2012

(65) Prior Publication Data

US 2013/0320842 A1 Dec. 5, 2013

(30) Foreign Application Priority Data

May 31, 2012 (KR) .................. 10-2012-0058812

(51) Int. Cl.
*H05B 33/12* (2006.01)
*H01J 9/20* (2006.01)
*H01L 51/52* (2006.01)
*H01L 27/32* (2006.01)

(52) U.S. Cl.
CPC .............. *H05B 33/12* (2013.01); *H01J 9/205* (2013.01); *H01L 51/5268* (2013.01); *H01L 27/322* (2013.01); *H01L 2251/5369* (2013.01)
USPC ........................................ 313/512

(58) Field of Classification Search
None
See application file for complete search history.

(56) References Cited

U.S. PATENT DOCUMENTS

| 7,927,771 | B2 | 4/2011 | Kim et al. | |
|---|---|---|---|---|
| 2007/0069635 | A1* | 3/2007 | Cok | 313/504 |
| 2007/0077349 | A1* | 4/2007 | Newman et al. | 427/66 |
| 2007/0103056 | A1* | 5/2007 | Cok | 313/503 |
| 2007/0200492 | A1* | 8/2007 | Cok et al. | 313/506 |
| 2007/0201056 | A1* | 8/2007 | Cok et al. | 358/1.9 |
| 2008/0042146 | A1* | 2/2008 | Cok et al. | 257/79 |
| 2013/0320842 | A1* | 12/2013 | Park et al. | 313/512 |
| 2014/0027798 | A1* | 1/2014 | Sato et al. | 257/89 |

FOREIGN PATENT DOCUMENTS

| JP | 1995-039002 U | 7/1995 |
|---|---|---|
| JP | 10-293203 A | 4/1998 |
| KR | 10-2006-0119158 A | 11/2006 |
| KR | 10-2010-0090056 A | 8/2010 |

* cited by examiner

*Primary Examiner* — Britt D Hanley
(74) *Attorney, Agent, or Firm* — Knobbe, Martens, Olson & Bear, LLP

(57) ABSTRACT

An organic light emitting display apparatus effectively improves viewing angle characteristics. The organic light emitting display apparatus includes a plurality of sub-pixels configured to emit light of different colors, respectively; a thin film encapsulation layer for sealing the plurality of sub-pixels; and a light scattering layer disposed over the thin film encapsulation layer to scatter light output from the plurality of sub-pixels.

8 Claims, 3 Drawing Sheets

ORGANIC LIGHT EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2012-0058812, filed on May 31, 2012, in the Korean Intellectual Property Office, the disclosure of which is incorporated herein in its entirety by reference.

BACKGROUND

1. Field

The present disclosure relates to an organic light emitting display apparatus, and more particularly, to an organic light emitting display apparatus which improves viewing angle characteristics and a method of manufacturing the organic light emitting display apparatus.

2. Discussion of the Related Technology

In general, an organic light emitting display apparatus realizes colors based on the principle whereby holes and electrons respectively emitted from an anode and a cathode recombine in a light emission layer, and has a stacked structure in which a light emission layer is inserted between a pixel electrode, which is the anode, and an opposite electrode, which is the cathode.

Unit pixels of the organic light emitting display apparatus include sub-pixels of red sub-pixels, green sub-pixels, and blue sub-pixels. These three-color sub-pixels are combined to represent desired colors. That is, each sub-pixel includes a light emission layer emitting one of red, green, and blue colors and is disposed between two electrodes. And a color of a unit pixel is represented by a suitable combination of these three-color lights.

SUMMARY

One aspect of the present invention provides an organic light emitting display apparatus which effectively improves viewing angle characteristics, and a method of manufacturing the organic light emitting display apparatus.

According to an aspect of the present invention, there is provided an organic light emitting display apparatus including: a plurality of sub-pixels configured to emit light of different colors, respectively; a thin film encapsulation layer for sealing the plurality of sub-pixels; and a light scattering layer disposed over the thin film encapsulation layer to scatter light output from the plurality of sub-pixels.

The light scattering layer may include a plurality of color filters each including a plurality of beads.

The plurality of sub-pixels may include first, second and third sub-pixels configured to emit red, green, and blue colors, respectively, wherein the plurality of color filters includes first, second and third color filters having colors substantially identical to colors emitted by the first, second and third sub-pixels, respectively.

The first, second and third color filters may be disposed in light output regions of the first, second and third sub-pixels, respectively, and the light scattering layer comprises black matrices, each of which may be disposed between two neighboring color filters of the plurality of the color filters.

The plurality of beads may be in a range from about 150 nm to about 1000 nm.

The light scattering layer may include black matrix including a plurality of beads.

Diameters of the plurality of beads may be in a range from about 150 nm to about 1000 nm.

A distance from an emission layer of each of the plurality of sub-pixels to the light scattering layer may be less than 100 μm.

According to another aspect of the present invention, there is provided a method of manufacturing an organic light emitting display apparatus, the method including: forming a plurality of sub-pixels for emitting light of different colors, respectively; forming a thin film encapsulation layer for sealing the plurality of sub-pixels; and forming, over the thin film encapsulation layer, a light scattering layer for scattering light output from the plurality of sub-pixels.

The forming of the light scattering layer may include: forming a plurality of color filters, each including a plurality of beads.

The plurality of sub-pixels may include first, second and third sub-pixels configured to emit red, green, and blue colors, respectively, wherein the plurality of color filters includes first, second and third color filters having have colors substantially identical to colors emitted by the first, second and third sub-pixels, respectively.

In the forming of the light scattering layer, the first, second and third color filters may be disposed in light output regions of the first, second and third sub-pixels, respectively, and black matrices may be disposed between two neighboring color filters of the plurality of color filters.

Diameters of the plurality of beads may be in a range from about 150 nm to about 1000 nm.

The light scattering layer may include black matrix including a plurality of beads.

Diameters of the plurality of beads may be in a range from about 150 nm to about 1000 nm.

A distance from an emission layer of each of the plurality of sub-pixels to the light scattering layer may be less than about 100 μm.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Embodiments of the present invention will now be described more fully with reference to the accompanying drawings.

In organic light emitting display devices, in order to improve light extraction efficiency of an organic light emitting display apparatus, more and more sub-pixels are formed to have a resonance structure. In the resonance structure, one of an anode and a cathode, where an image is formed, is formed as a semi-transmissive electrode, and the opposite electrode is formed as a total reflection electrode, so that light may travel reciprocally therebetween to generate constructive interference. Accordingly, considerably intensified light may be extracted from each sub-pixel.

However, if such a structure having high resonance is applied, while light extraction efficiency is increased, viewing angle characteristics may deteriorate due to an excessively high directivity of light. In some cases, if the high resonance structure is used, a color shift would seriously occur according to viewing angles.

Accordingly, in order to implement a highly reliable product, a new structure capable of satisfactorily maintaining viewing angle characteristics is required while still obtaining increased light extraction efficiency.

Figure 1:
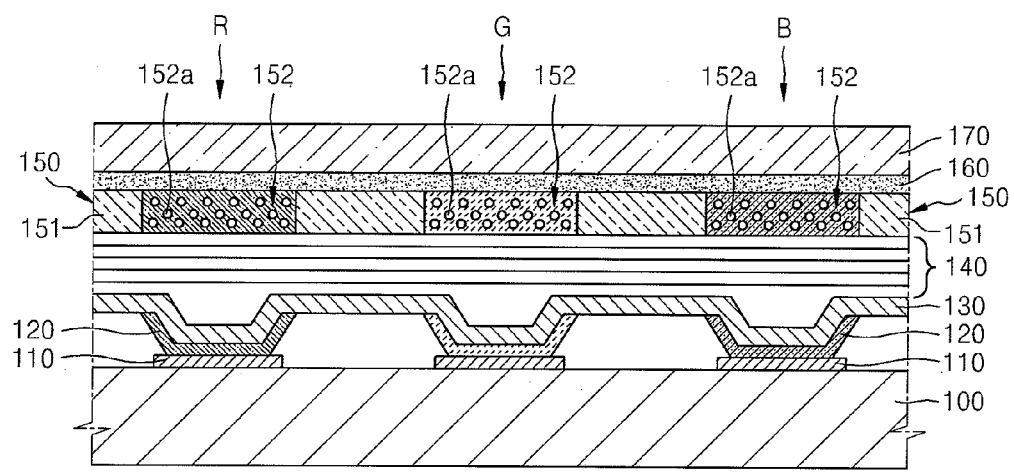
FIG. 1 is a cross-sectional view of a structure of an organic light emitting display apparatus according to an embodiment of the present invention.

FIG. 1 is a cross-sectional view of three-color sub-pixels (a red sub-pixel R, a green sub-pixel G, and a blue sub-pixel B) which form a unit pixel of an organic light emitting display apparatus, according to an embodiment of the present invention. In the organic light emitting display apparatus, unit pixels including these three-color sub-pixels R, G, and B are repeatedly arranged in row and column directions.

Referring to FIG. 1, first and second electrodes 110 and 130 facing each other and emission layers 120 disposed between the first and second electrodes 110 and 130 are formed on a substrate 100. Therefore, if an appropriate voltage is formed or applied between the first and second electrodes 110 and 130, the emission layers 120 emit light and represent colors of light.

A thin film encapsulation layer 140 for preventing external moisture or oxygen from penetrating is formed on the sub-pixels R, G, and B. The thin film encapsulation layer 140 may have a structure in which organic layers and inorganic layers are alternately and repeatedly stacked.

In embodiments, a light scattering layer 150 for scattering light output from each of the sub-pixels R, G, and G is formed on the thin film encapsulation layer 140. Light generated by the emission layers 120 of each of the sub-pixels R, G, and B is appropriately scattered by the light scattering layer 150 and is output to the outside. The light scattering layer 150 is an element for effectively improving viewing angle characteristics.

The light scattering layer 150 includes a color filter 152 disposed in a light output region of each of the sub-pixels R, G, and B and black matrices 151 for filling spaces between the two neighbor color filters 152. The color filter 152 includes a plurality of beads 152a each having a diameter of about 150 nm to about 1000 nm. In embodiments, each of color filters 132 uses a color associated with the color of light emitted by the corresponding one of the sub-pixel R, G, and B. In some embodiments, each of the color filters 152 uses a color substantially identical to a color of light emitted by the corresponding one of the sub-pixel R, G, and B. The beads 152a act to induce Mie scattering of light generated by the emission layers 120.

If light is incident into fine particles such as the beads 152a, light is generally scattered. In a case where a diameter of a particle is less than 1/10 of a light wavelength, forward scattering in which light scatters in a direction in which light travels and backward scattering in which light scatters in a direction in which light is reflected similarly occur. This is referred to as Rayleigh scattering.

However, in a case where the diameter of the particle is greater than 1/10 of the light wavelength, Mie scattering, in which the forward scattering overwhelmingly occurs compared to the backward scattering, is induced. In embodiments, the beads 152a of the light scattering layer 150 induce Mie scattering to allow the forward scattering to overwhelmingly occur, thereby improving viewing angle characteristics owing to light scattering while not deteriorating light extraction efficiency. The effect of improvement of the viewing angle characteristics will be described later.

Furthermore, to induce Mie scattering, the beads 152a need to have diameters greater than 1/10 of a corresponding light wavelength as described above. In consideration of a wavelength of light generated by the emission layers 120 of a general organic light emitting display apparatus, the beads 152a in the color filters for R (red) sub-pixel, G (green) sub-pixel and B (blue) sub-pixel have diameters greater than about 70 nm, about 55 nm, and about 40 nm, respectively. However, it would be difficult to actually manufacture beads having diameters between about 40 nm to about 70 nm. Furthermore, the greater the diameters of the beads 152, the more the forward scattering desired in the present invention occurs. Thus, the beads 152a having diameters greater than about 150 nm are appropriate in terms of the difficulty of manufacturing and effect of the forward scattering. However, extremely large diameters of the beads lead to relatively thick color filters, which may increase opacity of the color filters. In embodiments, the maximum diameters of the beads 152a may be less than about 1000 nm, i.e. about 1 μm.

Similarly, extremely thick encapsulation layer may lead to increased opacity and deterioration of light extraction efficiency. In embodiments, a thickness of the thin film encapsulation layer 140 may be set in such a way that a distance from the emission layer 120 of each of the sub-pixels R, G, and B to the light scattering layer 150 is less than about 100 μm.

Reference numeral 170 denotes a touch screen panel attached to an outermost layer of the organic light emitting display apparatus by using an adhesive layer 160 therebetween.

The organic light emitting display apparatus having the above-described structure may be manufactured as follows.

Figure 2A:
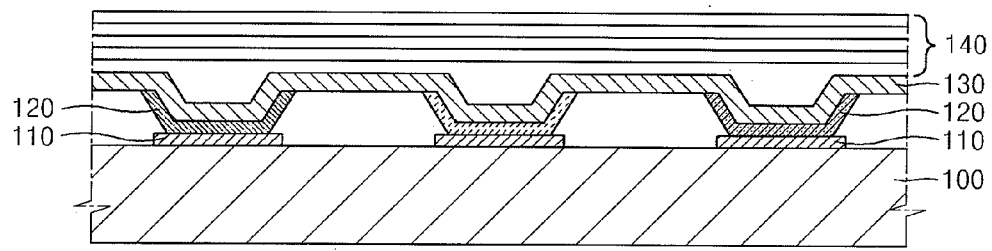
FIGS. 2A through 2C are cross-sectional views for sequentially explaining a method of manufacturing the organic light emitting display apparatus of FIG. 1.

Referring to FIG. 2A, the first electrodes 110, the emission layers 120, and the second electrode 130 of the three-color sub-pixels R, G, and B are sequentially formed on the substrate 100, and then the thin film encapsulation layer 140 covers and seals the first electrodes 110, the emission layers 120, and the second electrode 130. In this regard, the thickness of the thin film encapsulation layer 140 is formed in such a way that the distance from the emission layers 120 to the light scattering layer 150 is less than about 100 μm as described above.

Figure 2B:
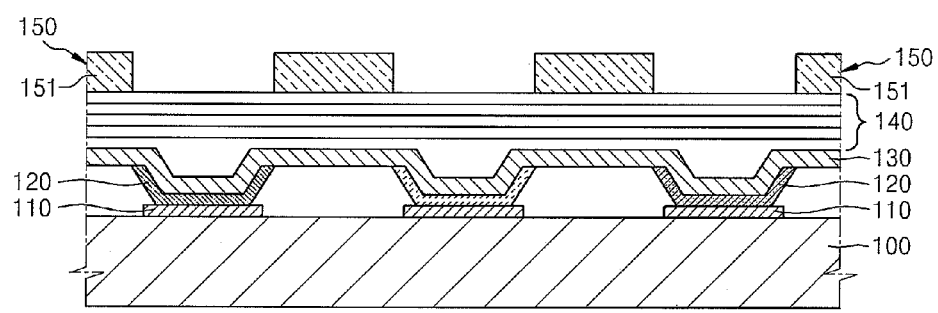

Thereafter, referring to FIG. 2B, in embodiments, the black matrices 151 of the light scattering layer 150 are patterned and formed. The black matrices 151 may be formed in a pattern with positions of the color filters 152 exposed by way of for example, depositing carbon black, and then patterning the deposited carbon black through photolithography processing.

Figure 2C:
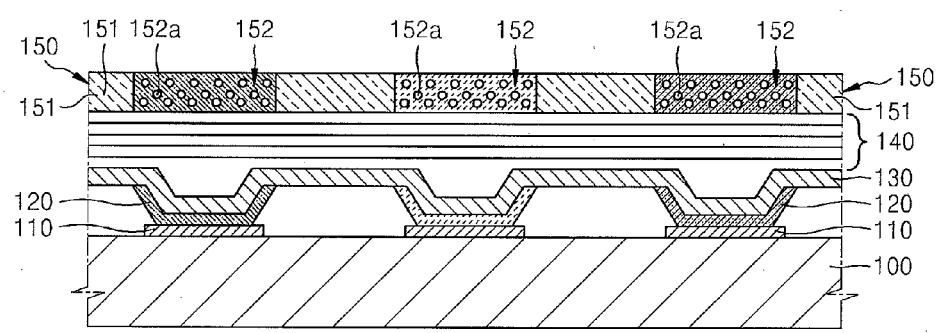

Thereafter, referring to FIG. 2C, the color filters 152 including the beads 152a are formed. The beads 152a may use, for example, a $ZrO_2$ material. The color filters 152 may be formed by depositing and patterning a polymer material containing the beads 152a.

Thereafter, the organic light emitting display apparatus having the structure of FIG. 1 is manufactured by applying the adhesive layer 160 onto the light scattering layer 150 and attaching the touch screen panel 170 onto the adhesive layer 160.

Viewing angle characteristics of the above-manufactured organic light emitting display apparatus do not deteriorate even though a resonance structure that increases light extraction efficiency is employed. The reason for this is that light having high directivity due to the resonance structure is transmitted through the light scattering layer 150 to induce Mie scattering and is scattered and output as described above. Thus, an amount of light output to the front of the organic light emitting display apparatus and an amount of light output at a slightly oblique angle has no difference, thereby reducing a color shift according to a viewing angle.

Figure 3:
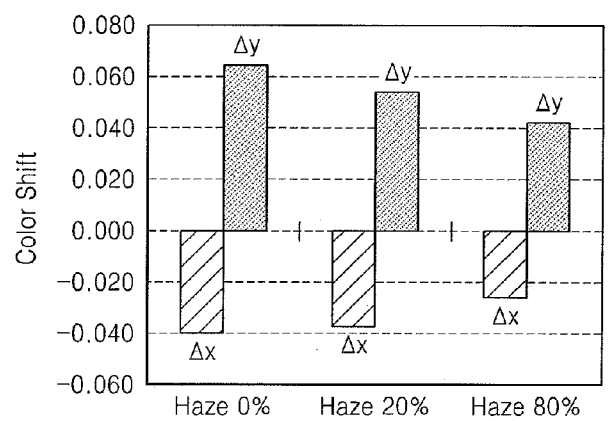
FIG. 3 is a graph of color shift characteristics of the organic light emitting display apparatus of FIG. 1.

FIG. 3 is a graph of color shift characteristics of the organic light emitting display apparatus according to an embodiment of the present invention. A color shift level (a minus value of the graph) is measured at an oblique angle of 60 degrees in an X-axis direction from the center of a screen. A color shift level (a plus value of the graph) is measured at an oblique angle of 60 degrees in a Y-axis direction from the center of the screen. In the graph, a Haze value indicates opacity of the light scattering layer 150 according to content of the beads 152a. If the Haze value is 0, the color filters 150 do not have beads. As the Haze value increases from 20% to 80%, the content of the beads 152a increases. As shown in the graph, if the color filters 152 including the beads 152a are used as the light scattering layer 150, the color shift level measured at the oblique angle of 60 degrees of the screen has a deviation less than about 5% compared to that measured at the front of the screen.

Therefore, such a structure may result in an implementation of an organic light emitting display apparatus having a very small color shift according to a viewing angle even though light extraction efficiency increases.

Figure 4:
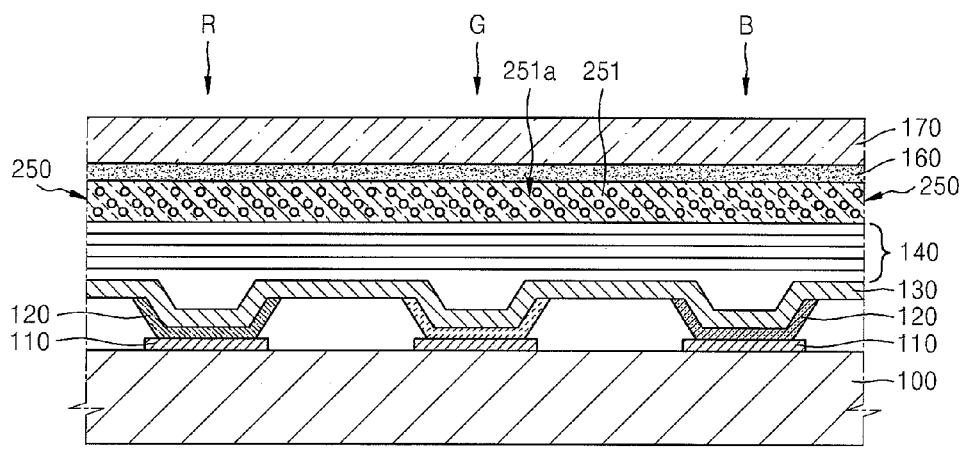
FIG. 4 is a cross-sectional view of a structure of an organic light emitting display apparatus according to another embodiment of the present invention.

Meanwhile, the light scattering layer 150 has a structure including the black matrices 151 and the color filters 152 in the above-described embodiment. In embodiments illustrated in FIG. 4, however, a light scattering layer 250 having a structure in which beads 251a are included in a black matrix 251 may be configured while no color filter is formed. In this case, since light needs to be transmitted through the black matrix 251, although light extraction efficiency deteriorates compared to the above-described embodiment, viewing angle characteristics, i.e., a color shift deviation according to a viewing angle, may be reduced owing to the induction of Mie scattering by the beads 251a. Therefore, even though light extraction efficiency slightly deteriorates, the structure of FIG. 4 may be employed in order to improve viewing angle characteristics.

Accordingly, the above-described organic light emitting display apparatus may resolve a problem that viewing angle characteristics deteriorate when light extracting efficiency increases. In addition, since a light scattering layer including a black matrix inhibits external light from being reflected, an auxiliary effect whereby an additional polarizing film does not need to prevent external light from being reflected may be obtained. Thus, the organic light emitting display apparatus may result in the implementation of a more reliable product.

While embodiments of the present invention have been particularly shown and described, it will be understood by those of ordinary skill in the art that various changes in form and details may be made therein without departing from the spirit and scope of the present invention as defined by the following claims.

What is claimed is:

1. An organic light emitting display apparatus comprising:
   a plurality of sub-pixels configured to emit light;
   a thin film encapsulation layer formed over the plurality of sub-pixels for sealing the plurality of sub-pixels; and
   an optical layer disposed over the thin film encapsulation layer, the optical layer comprising a black matrix and a plurality of beads dispersed in the black matrix to scatter light output from the plurality of sub-pixels.

2. The organic light emitting display apparatus of claim 1, wherein the plurality of sub-pixels comprise first, second and third sub-pixels configured to emit red, green, and blue colors, respectively.

3. The organic light emitting display apparatus of claim 1, wherein diameters of the plurality of beads are in a range from about 150 nm to about 1000 nm.

4. The organic light emitting display apparatus of claim 1, wherein a distance from an emission layer of each of the plurality of sub-pixels to the optical layer is less than about 100 van.

5. A method of manufacturing an organic light emitting display apparatus, the method comprising:
   forming a plurality of sub-pixels for emitting light;
   forming a thin film encapsulation layer over the plurality of sub-pixels for sealing the plurality of sub-pixels; and
   forming, over the thin film encapsulation layer, an optical layer comprising a black matrix and a plurality of beads dispersed in the black matrix for scattering light output from the plurality of sub-pixels.

6. The method of claim 5, wherein the plurality of sub-pixels comprise first, second and third sub-pixels configured to emit red, green, and blue colors, respectively.

7. The method of claim 5, wherein diameters of the plurality of beads are in a range from about 150 nm to about 1000 nm.

8. The method of claim 5, wherein a distance from an emission layer of each of the plurality of sub-pixels to the optical layer is less than about 100 μm.

* * * * *

UNITED STATES PATENT AND TRADEMARK OFFICE
CERTIFICATE OF CORRECTION

PATENT NO. : 8,970,108 B2
APPLICATION NO. : 13/673889
DATED : March 3, 2015
INVENTOR(S) : Park et al.

It is certified that error appears in the above-identified patent and that said Letters Patent is hereby corrected as shown below:

Title Page, Item (72) Inventors, should read

-- (72) Inventors: Soon Ryong Park, Yongin (KR);
　　　　　　　　Woo-Suk Jung, Yongin (KR);
　　　　　　　　Hee-Seong Jeong, Yongin (KR);
　　　　　　　　Chulwoo Jeong, Yongin (KR) --.

Signed and Sealed this
Second Day of August, 2016

Michelle K. Lee
*Director of the United States Patent and Trademark Office*